US011258461B2

(12) United States Patent
Chuang et al.

(10) Patent No.: US 11,258,461 B2
(45) Date of Patent: Feb. 22, 2022

(54) DATA PROCESSING DEVICE AND METHOD

(71) Applicant: Realtek Semiconductor Corporation, Hsinchu (TW)

(72) Inventors: Yao-Chun Chuang, Changhua County (TW); Hsin-Yun Hu, Taichung (TW); Ching-Yen Lee, Hsinchu (TW); Ming-Jhe Du, Tainan (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 25 days.

(21) Appl. No.: 17/034,101

(22) Filed: Sep. 28, 2020

(65) Prior Publication Data

US 2021/0126651 A1  Apr. 29, 2021

(30) Foreign Application Priority Data

Oct. 24, 2019  (TW) .................................. 108138469

(51) Int. Cl.
*H03M 13/00* (2006.01)
*H03M 13/11* (2006.01)
*H03M 13/29* (2006.01)

(52) U.S. Cl.
CPC ...... *H03M 13/1111* (2013.01); *H03M 13/116* (2013.01); *H03M 13/1137* (2013.01); *H03M 13/2957* (2013.01)

(58) Field of Classification Search
CPC .......... H03M 13/1111; H03M 13/1137; H03M 13/116; H03M 13/2957
See application file for complete search history.

(56) References Cited

U.S. PATENT DOCUMENTS 6,178,056 B1 * 1/2001 Cloke .............. G11B 20/10009
360/46
6,957,382 B2  10/2005 Otto et al.
(Continued)

FOREIGN PATENT DOCUMENTS

CN   1422005 A   6/2003
CN   105827351 A  8/2016

OTHER PUBLICATIONS

IEEE, "IEEE Standard for Ethernet Amendment 4: Physical Layer Specifications and Management Parameters for 1 Gb/s Operation over a Single Twisted-Pair Copper Cable", IEEE Std 802.3bp-2016 (Amendment to IEEE Std 802.3-2015 as amended by IEEE Std 802.3bw-2015, IEEE Std 802.3by-2016, and IEEE Std 802.3bq-2016), pp. 1-211, Sep. 9, 2016.
(Continued)

*Primary Examiner* — Esaw T Abraham
(74) *Attorney, Agent, or Firm* — Locke Lord LLP; Tim Tingkang Xia, Esq.

(57) ABSTRACT

A data processing device includes decoder circuits, a checker circuit, and a control circuit. The decoder circuits set groups of first sampling points and groups of second sampling points according to an initial transition edge of a first signal, and perform a parallel decoding on the first signal according to the groups of first sampling points and the groups of second sampling points, in order to generate a second signal and a third signal. The checker circuit checks the second signal and the third signal, in order to generate a check result. The control circuit selects at least one of the decoder circuits according to the check result for receiving subsequent data.

20 Claims, 5 Drawing Sheets

(56) References Cited

U.S. PATENT DOCUMENTS

| | | | | |
|---|---|---|---|---|
| 6,977,965 B2* | 12/2005 | Nguyen | ............... | H04L 7/0054 |
| | | | | 375/223 |
| 7,042,925 B2* | 5/2006 | Shiue | ............... | H03G 3/3052 |
| | | | | 370/509 |
| 7,215,721 B2* | 5/2007 | Hietala | ............... | H04L 1/004 |
| | | | | 375/317 |
| 7,957,464 B2* | 6/2011 | Yamazaki | ............ | H04L 25/4908 |
| | | | | 375/239 |
| 8,625,706 B2* | 1/2014 | Shimizu | ............... | H04L 7/0008 |
| | | | | 375/293 |
| 9,853,647 B2 | 12/2017 | Chang | | |
| 9,860,088 B1* | 1/2018 | DeSimone | ............... | G11C 5/04 |
| 10,284,360 B2* | 5/2019 | Choi | ............... | H04L 7/0037 |
| 10,908,636 B2* | 2/2021 | Tomar | ............... | G06F 1/10 |

OTHER PUBLICATIONS

The office action of the corresponding Chinese application No. 201911051148.7 dated Sep. 16, 2021.

* cited by examiner

DATA PROCESSING DEVICE AND METHOD

RELATED APPLICATIONS

This application claims priority to Taiwanese Application Serial Number 108138469, filed Oct. 24, 2019, which is herein incorporated by reference.

BACKGROUND

Technical Field

The present disclosure relates to a data processing device. More particularly, the present disclosure relates to a data processing device and method having a decoder circuit.

Description of Related Art

In practical applications, due to various non-ideal factors, an error may exist on a signal transmitted from a transmitter to a receiver. The non-ideal factors are, for example, the channel effect, the clock jitter, the clock skew. For receiving a signal correctly, the present receivers may speed up the sampling rate to process the signal, to tolerate a certain amount of errors. However, when the data processing speed is faster, the method of speeding up the sampling rate is difficult to be implemented in practical manufacture. In addition, speeding up the sampling rate also causes power consumption of the receiver circuit to be increased significantly.

SUMMARY

Some aspects of the present disclosure are to provide a data processing device. The data processing device includes decoder circuits, a checker circuit, and a control circuit. The decoder circuits set groups of first sampling points and groups of second sampling points according to an initial transition edge of a first signal, and perform a parallel decoding on the first signal according to the groups of first sampling points and the groups of second sampling points, in order to generate a second signal and a third signal. The checker circuit checks the second signal and the third signal, in order to generate a check result. The control circuit selects at least one of the decoder circuits according to the check result for receiving subsequent data.

Some aspects of the present disclosure are to provide a data processing method. The data processing method includes: setting a plurality of groups of first sampling points and a plurality of groups of second sampling points according to an initial transition edge of a first signal; performing a parallel decoding on the first signal by a plurality of decoder circuits according to the groups of first sampling points and the groups of second sampling points, in order to generate a second signal and a third signal; checking the second signal and the third signal, in order to generate a check result; and selecting at least one of the decoder circuits according to the check result for receiving subsequent data.

As described above, the data processing device and the data processing method in some embodiments of the present disclosure can utilize multiple decoder circuits to perform the parallel decoding on the received signal. Thus, accuracy of receiving the signal can be increased significantly under a condition that the sampling rate is maintained to be the same.

DETAILED DESCRIPTION

The terms used in this specification generally have their ordinary meanings in the art. The definitions of the terms in common dictionary and examples in the present disclosure where each term is used are only for illustration, and should not limit the present disclosure. Similarly, the present disclosure is not only limited to various embodiments in this specification.

In this document, "connected" or "coupled" may be referred to "electrically connected" or "electrically coupled." "Connected" or "coupled" may also refer to operations or actions between two or more elements.

In this document, the term "circuitry" may indicate a system formed with one or more circuits. The term "circuit" may indicate an object, which is formed with one or more transistors and/or one or more active/passive elements based on a specific arrangement, for processing signals.

Figure 1:
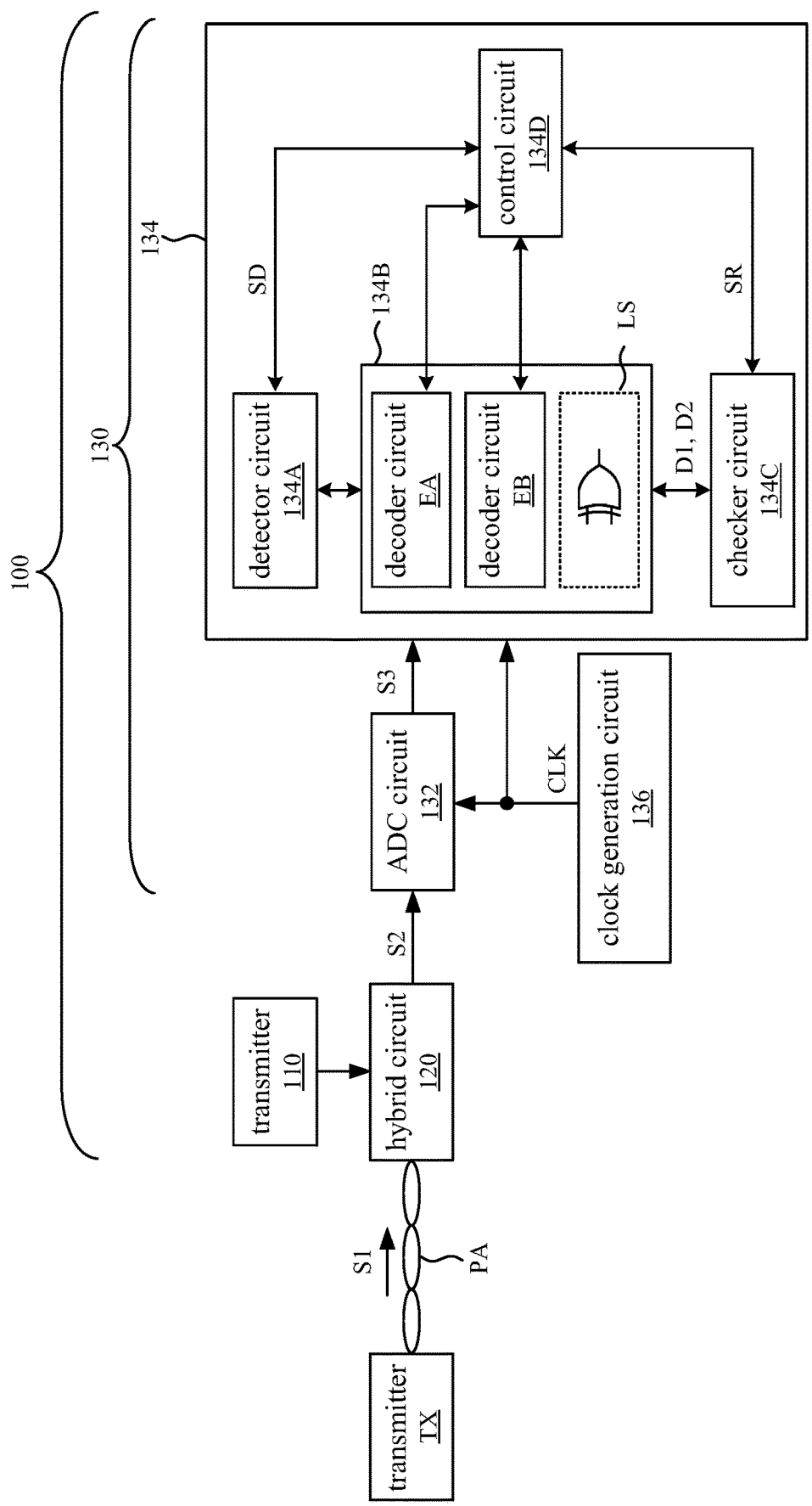
FIG. 1 is a schematic diagram illustrating a transceiver according to some embodiments of the present disclosure.

FIG. 1 is a schematic diagram illustrating a transceiver 100 according to some embodiments of the present disclosure. In some embodiments, the transceiver 100 includes a transmitter 110, a hybrid circuit 120, and a receive 130. The transmitter 110 works in coordination with the hybrid circuit 120 and the receive 130, to be connected to and/or receive a signal from other electrical devices (for example, a transmitter TX). In some embodiments, the transceiver 100 is coupled to the transmitter TX via a path PA. In some embodiments, the path PA may be implemented by a twisted pair.

In some embodiments, the hybrid circuit 120 may include a signal processing circuit, for example, an interface circuit, a signal modulation circuit, an amplifier, a filter, a codec circuit etc., to perform a preliminary processing on a signal S1 from the transmitter TX, in order to generate a signal S2 to the receiver 130. The setting method of setting the hybrid circuit 120 is for illustration, and the present disclosure is not limited thereto.

The receiver 130 includes an analog-to-digital converter (ADC) circuit 132, a data processing device 134, and a clock generation circuit 136. The clock generation circuit 136 generates at least one clock signal CLK for the ADC circuit 132 and/or the data processing device 134 to utilize. In some embodiments, the clock generation circuit 136 may include an oscillator, a phase locked loop etc., but the present disclosure is not limited thereto.

The ADC circuit 132 converts the signal S2 to be a signal S3, and transmits the signal S3 to the data processing device 134. In some embodiments, the data processing device 134 may be applied to automotive electrical devices, to perform a signal transmission procedure (for example, Auto-negotiation) with other automotive devices. The data processing device 134 sets groups of sampling points according to the signal S3 to perform a parallel decoding on the signal S3, thereby determines whether data on the received signal S1 is correct or not.

In this example, the data processing device 134 includes a detector circuit 134A, a decoder 134B, a checker circuit 134C, and a control circuit 134D. The control circuit 134D controls the detector circuit 134A, the decoder 134B, and the checker circuit 134C, to perform operations of a data processing method 400 described below. In some embodiments, the control circuit 134D may be implemented by a digital signal processing circuit and/or a digital logic circuit performing a finite-state machine.

The detector circuit 134A detects whether there is a predetermined pattern on the signal S3 or not. When the predetermined pattern is detected, the detector circuit 134A outputs a detection signal SD to the control circuit 134D, to start to perform the data processing method 400 described below. In some embodiments, the predetermined pattern may be a combination of specific logic values. For example, the specific logic values are "1111". In some embodiments, the predetermined pattern may be a start delimiter of a communication protocol (for example but not limited to, IEEE 802.3 bp).

The decoder 134B performs the parallel decoding according to the signal S3, to generate a signal D1 and a signal D2 to the checker circuit 134C. In some embodiments, the parallel decoding is to perform decoding operations on the same signal at the same time. For example, the decoder 134B includes a decoder circuit EA and a decoder circuit EB. The decoder circuit EA samples the signal S3 at a first timing, and performs decoding according to the sampled signal S3, to generate the signal D1. The decoder circuit EB samples the signal S3 at a second timing, and performs decoding according to the sampled signal S3, to generate the signal D2. In some embodiments, the second timing is earlier than the first timing. These operations are described with reference to FIG. 3.

The checker circuit 134C performs a data check calculation to the signal D1 and the signal D2 respectively, to confirm whether the signal D1 and the signal D2 is conformed to the signal S3 or not, and sends back a check result SR to the control circuit 134D. If the signal D1 is checked to be correct, it is that the decoder circuit EA can receive the signal S3 correctly. If the signal D2 is checked to be correct, it is that the decoder circuit EB can receive the signal S3 correctly. In some embodiments, the control circuit 134D can select one of the decoder circuit EA or the decoder circuit EB according to the check result SR for receiving subsequent data.

In some embodiments, the aforementioned data check calculation may be the Cyclic Redundancy Check (CRC), for example, CRC-16, but the present disclosure is not limited thereto. In some embodiments, the checker circuit 134C may be a combination of logic circuits, register circuits, and etc. which can perform the aforementioned data check calculation.

Figure 2:
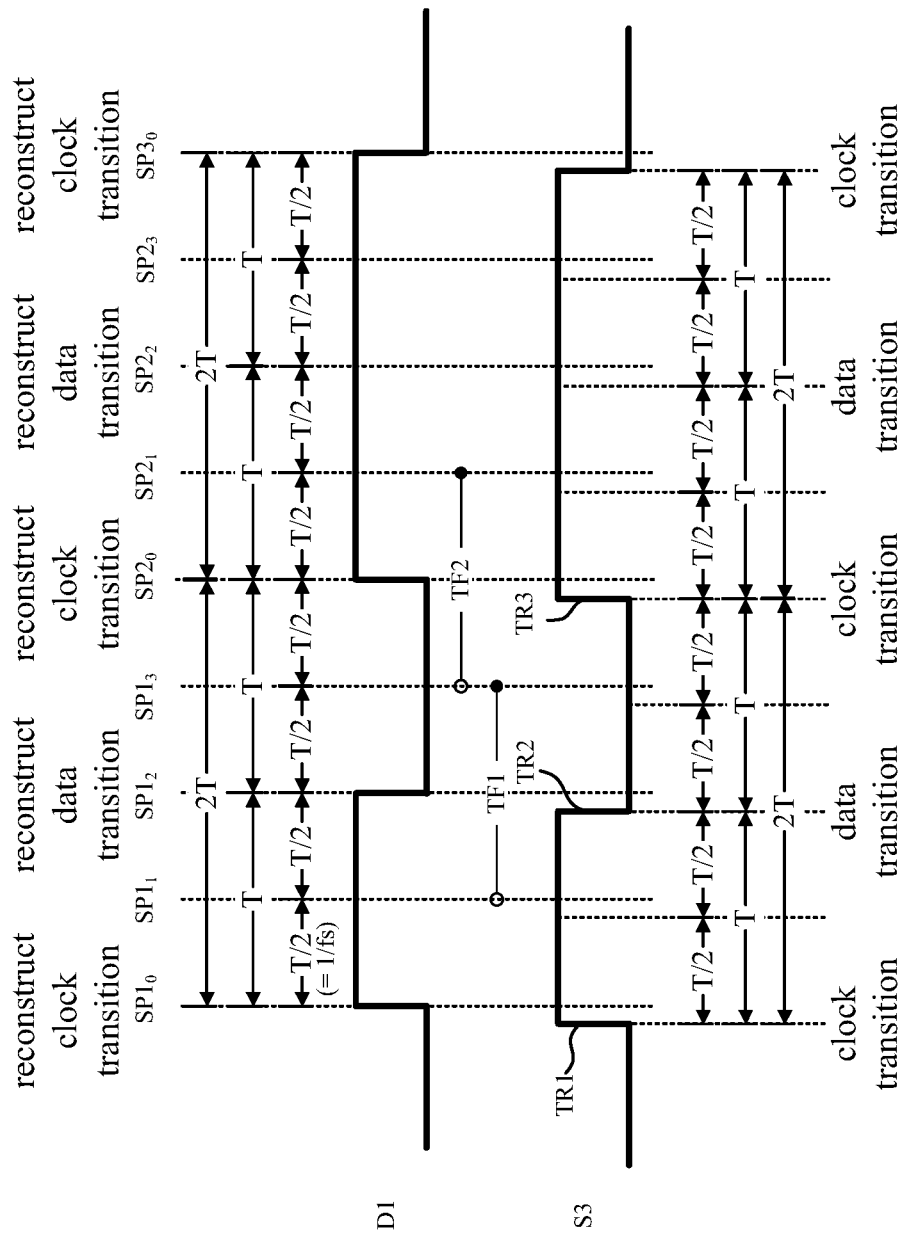
FIG. 2 is a schematic diagram illustrating waveforms of signals in FIG. 1 according to some embodiments of the present disclosure.

FIG. 2 is a schematic diagram illustrating waveform of the signal S3 and the signal D1 in FIG. 1 according to some embodiments of the present disclosure. In some embodiments, due to an introduced delay during a signal transmission and operations of the circuits, there is a delay between the signal S3 and the signal D1.

In some embodiments, when the transceiver 100 is applied to an automotive electrical device, the signal S3 is conformed to an IEEE 802.3 bp protocol. Under this protocol, a coding form of the signal S3 is Manchester Coding. As illustrated in FIG. 2, in this form, the signal S3 has three data transition edges TR1-TR3 every cycle 2T. The first transition edge TR1 is a clock transition, the second transition edge TR2 is a data transition, and the third transition edge TR3 is a clock transition. A period between the transition edge TR1 and the transition edge TR2 is a period T (that is, a half of the cycle 2T), and a period between the transition edge TR2 and the transition edge TR3 is a period T. In Manchester Coding, during a cycle 2T, if there is a transition on the signal S3, it is that data on the signal S3 is the first bit value (for example, a bit 1). Alternatively, during a cycle 2T, if there is no transition on the signal S3, it is that data on the signal S3 is the second bit value (for example, a bit 0).

In some embodiments, a sampling rate fs of each of the decoder circuit EA and the decoder circuit EB to the signal S3 is set to be 2/T, to ensure that the signal D1 or D2 is sufficient to reflect the signal S3. As illustrated in FIG. 2, when the decoder circuit EA detects the first transition edge TR1 on the signal S3, the decoder circuit EA sets a corresponding time to be an initial sampling point $SP1_0$. Then, the decoder circuit EA samples the signal S3 once each duration T/2. For example, the decoder circuit EA samples the signal S3 at sampling points $SP1_0$-$SP1_3$, $SP2_0$-$SP2_3$, and $SP3_0$ sequentially, to reconstruct the clock transition or the data transition.

Four sampling points (that is $SPX_0$-$SPX_3$, X=1, 2, 3, . . . ) form a group, in which two of the sampling points are spaced a period T/2 sequentially. In the first group of sampling points $SP1_0$-$SP1_3$, the sampling point $SP1_0$ is corresponding to the first transition edge TR1, and the sampling point $SP1_2$ is corresponding to the second transition edge TR2. Then, in the next group of sampling points $SP2_0$-$SP2_3$, the sampling point $SP2_0$ is corresponding to the third transition edge TR3. By analogy, the decoder circuit EA can generate the signal D1 which is configured to reflect the signal S3.

In some embodiments, the decoder circuit EA can determine the data transition on the signal S3 according to signal values of the signal D1 during a period TF1. The period TF1 is a period (time length is 1T) from the second sampling point $SPX_1$ of the current group of sampling point $SPX_0$-$SPX_3$ to a last sampling point $SPX_3$ of the current group of sampling point $SPX_0$-$SPX_3$.

For example, during the period TF1 from the sampling point $SPX_1$ to the sampling point $SP1_3$, a signal value of the signal D1 is transited from a logic value 1 to a logic value 0. The period TF1 is a time period which starts from but excludes the sampling point $SP1_1$ (a hollow point in the figure) to and includes the sampling point $SP1_3$ (a solid point in the figure). Thus, the decoder circuit EA can determine whether there is the data transition on the signal S3 or not. Under this condition, it can determine that the data on the signal S3 is the bit 1. Alternatively, if there is no data transition on the signal D1 during the period TF1, it can determine the data on the signal S3 is the bit 0.

In some embodiments, the decoder circuit EA can determine the clock transition on the signal S3 according to the signal values of the signal D1 during a period TF2. The period TF2 is a period (time period is 1T) from the last sampling point $SPX_3$ of the group of sampling points $SPX_0$-$SPX_3$ to a second sampling point $SPY_1$ of a next group of sampling points $SPY_0$-$SPY_3$, in which Y=X+1, and X and Y are positive integers.

For example, since requirements of Manchester Coding, there is a clock transition on the transition edge TR3 on the signal S3. During the period TF2 from the sampling point $SP1_3$ to the sampling point $SP2_1$, the logic value of the signal D1 is transited from the logic value 0 to the logic value 1. Thus, the decoder circuit EA can determine that there is a clock transition on the signal S3.

Accordingly, with the detection mechanism above, the decoder circuit EA can determine whether signal values of the signal S3 and the signal S3 are conformed to a predetermined pattern correctly or not, to generate the signal D1 which is sufficient to reflect the signal S3.

Figure 3:
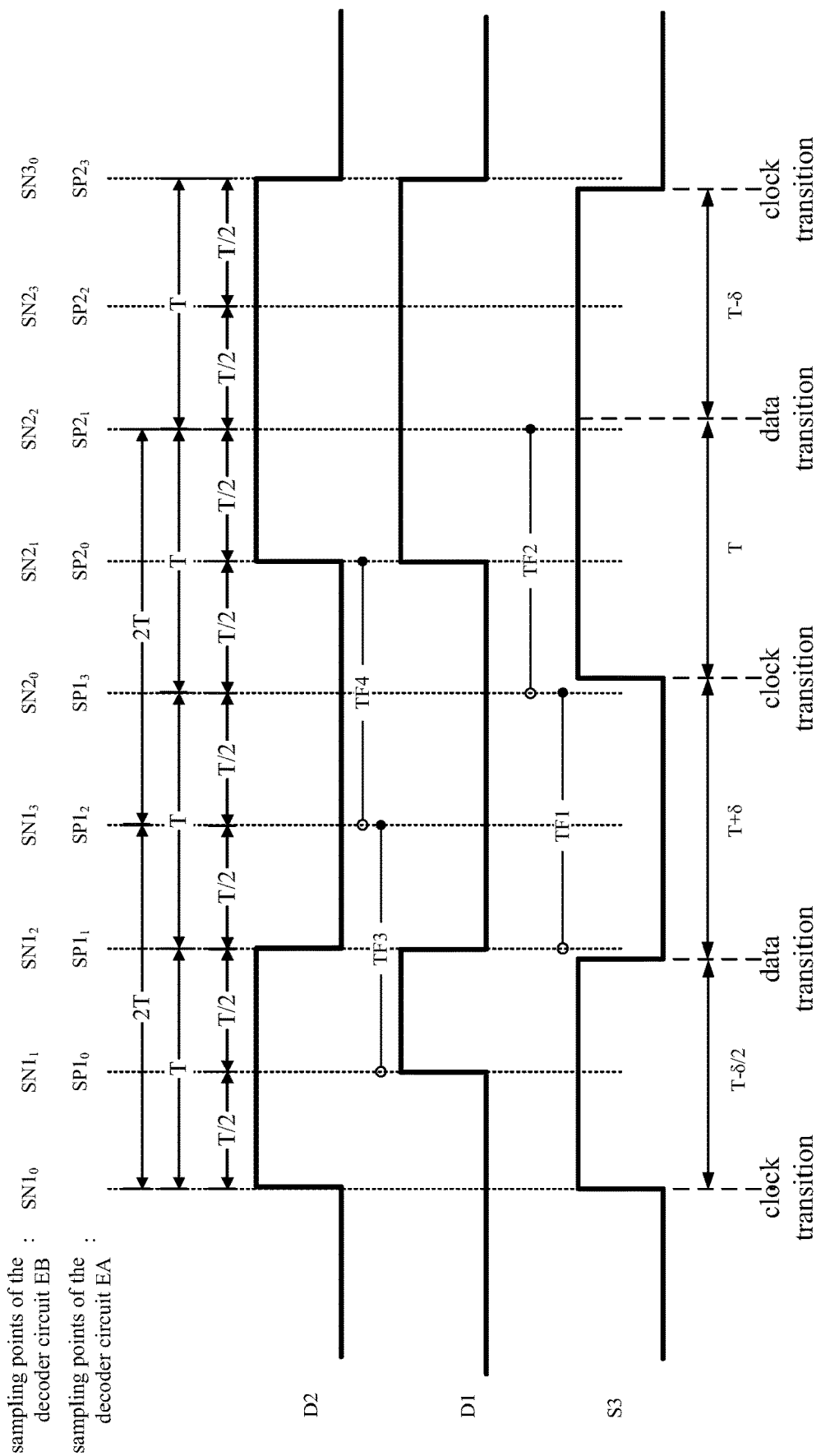
FIG. 3 is a schematic diagram illustrating waveforms of signals in FIG. 1 and sampling timing of a decoder according to some embodiments of the present disclosure.

FIG. 3 is a flow diagram illustrating waveforms of signals S3 and D1-D2 in FIG. 1 and sampling timing of the decoder 134B according to some embodiments of the present disclosure.

Under some conditions, if a random error 6 is introduced during the signal transmission due to the channel effect, the clock jitter, the clock skew, the cycle of the signal S3 is not 2T or a period between two continues transition edges is not T. Under this condition, the decoder circuit EA could not generate the signal D1 correctly. In some embodiments, the decoder circuit EB can improve this problem.

As described above, when the decoder circuit EA detects the first transition edge TR1 on the signal S3, the decoder circuit EA sets a corresponding sampling time as the initial sampling time $SP1_0$, and sets the groups of sampling points $SP1_1$-$SP2_3$. In this example, an initial sampling point of the decoder circuit EB is set to be the initial sampling point $SN1_0$, in which the timing of initial sampling point $SN1_0$ is earlier than the timing of the initial sampling point $SP1_0$ of decoder circuit EA, and the initial sampling point $SN1_0$ and the initial sampling point $SP1_0$ are spaced by the period T/2 (that is, ¼ time the period 2T). Then, each period T/2, the decoder circuit EB sets a sampling point. In other words, the decoder circuit EB also sets sampling points $SN1_0$-$SN1_3$, $SN2_0$-$SN2_3$, and $SN3_0$ sequentially from the initial sampling point $SN1_0$.

Similarly, four sampling points (that is, $SNX_0$-$SNX_3$) form a group, in which two of the sampling points are spaced by the period T/2 sequentially. The timing of the sampling point $SNX_1$ is the same to the timing of the sampling point $SPX_0$, the timing of the sampling point $SNX_2$ is the same to the timing of the sampling point $SPX_1$, the timing of the sampling point $SNX_3$ is the same to the timing of the sampling point $SPX_2$, and the timing of the sampling point $SNY_0$ is the same to the timing of the sampling point $SPX_3$. Accordingly, the decoder circuit EB can perform the same operations of the decoder circuit EA above according to the sampling points $SNX_0$-$SNX_3$, to generate the signal D2.

For example, if there is a data transition on the signal D2 during the period TF3 from the sampling point $SNX_1$ to the sampling point $SNX_3$, it can determine that the corresponding data on the signal S3 is the bit 1. Alternatively, if there is no data transition on the signal S2 during the period TF3, it can determine that the corresponding data on the signal S3 is the bit 0. The decoder circuit EB can determine whether there is a clock transition on the signal D2 during the period TF4 from the sampling point $SNX_3$ to the sampling point $SNY_1$ or not, to determine whether the signal S3 is conformed to Manchester Coding or not. Accordingly, the decoder circuit EB can generate the signal D2 which is sufficient to reflect the signal S3.

As described above, the checker circuit 134C can perform the data check calculation to the signal D2 and the signal D1, to determine whether at least one of the decoder circuit EA or the decoder circuit EB is able to decode the signal S3 correctly or not. Thus, by analyzing the signal S3 at different timing by the multiple decoder circuits EA and EB respectively, it can ensure that the signal S3 can be received by the transceiver 100 correctly even when there is the random error 6.

In some embodiments, since the sampling point $SNX_0$ is earlier than the sampling point $SPX_0$, the decoder circuit EB finishes decoding to signal S3 before the decoder circuit EA finishes decoding to the signal S3. Under this condition, the checker circuit 134C checks the signal D2 first, and then checks the signal D1. Thus, efficiency of data processing can be increased.

In some embodiments, as illustrated in FIG. 1, the decoder 134B further includes level sensor circuits LS. The level sensor circuits LS compare two signal values of the signal D1 (or the signal D2) during the period TF1 (or the period TF3), to determine whether there is a data transition on the signal S3 or not. In some embodiments, the level sensor circuits LS further compare two signal values of the signal D1 (or the signal D2) during the period TF2 (or the period TF4), to determine whether there is a clock transition on the signal S3 or not.

In some embodiments, each of the decoder circuit EA and the decoder circuit EB may have a group of level sensor circuits LS, to perform operations above to generate the signals D1 and D2. In some other embodiments, the decoder circuit EA and the decoder circuit EB may share a group of level sensor circuits LS. One of the level sensor circuits LS may be implemented by Exclusive-OR gate, but the present disclosure is not limited thereto.

The setting methods of setting the decoder circuit EA, the decoder circuit EB, and the level sensor circuits LS are for illustration. Various setting methods for completing similar operations are within the scope of the present disclosure.

Figure 4A:
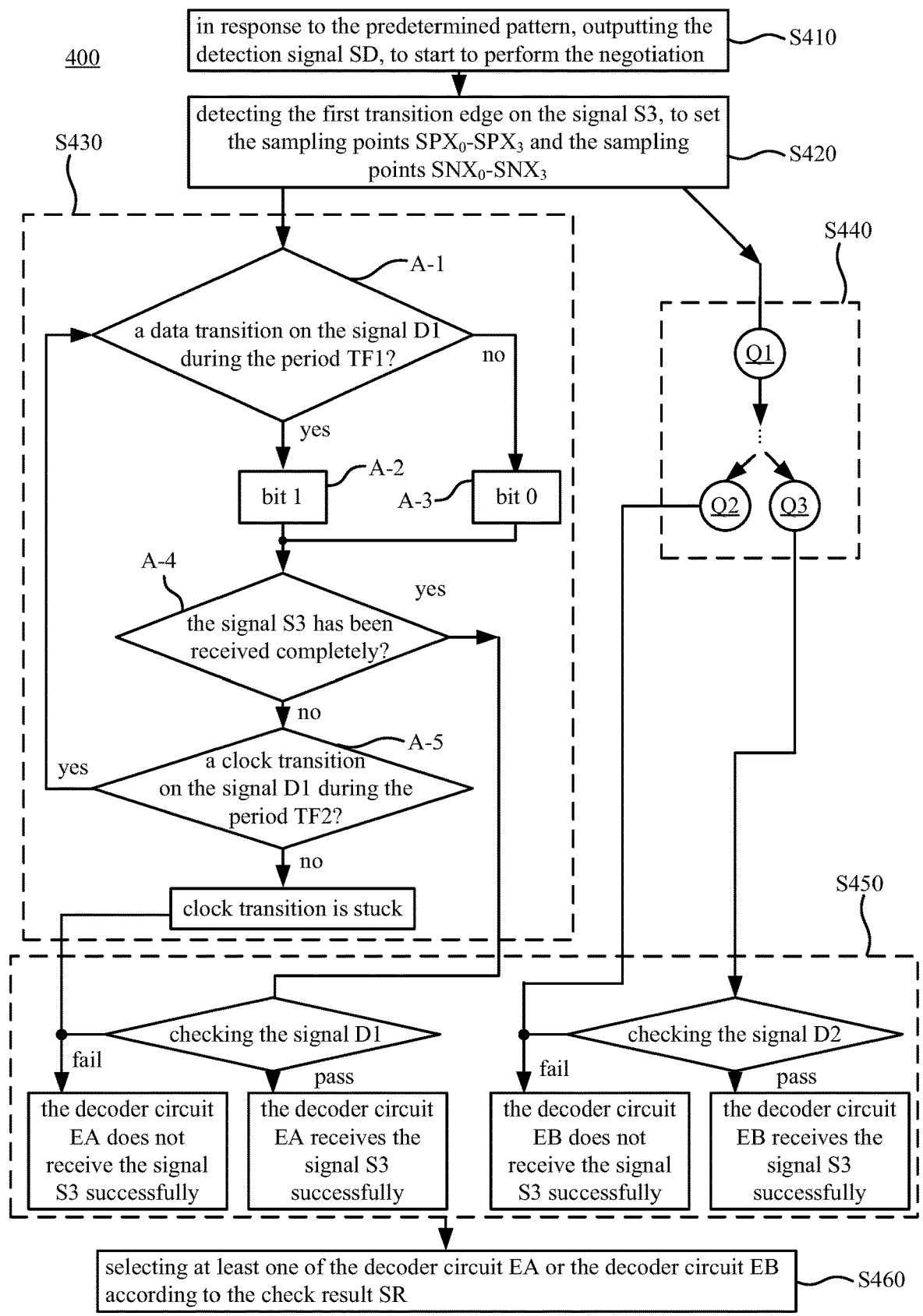
FIG. 4A is a flow diagram illustrating a data processing method according to some embodiments of the present disclosure.
Figure 4B:
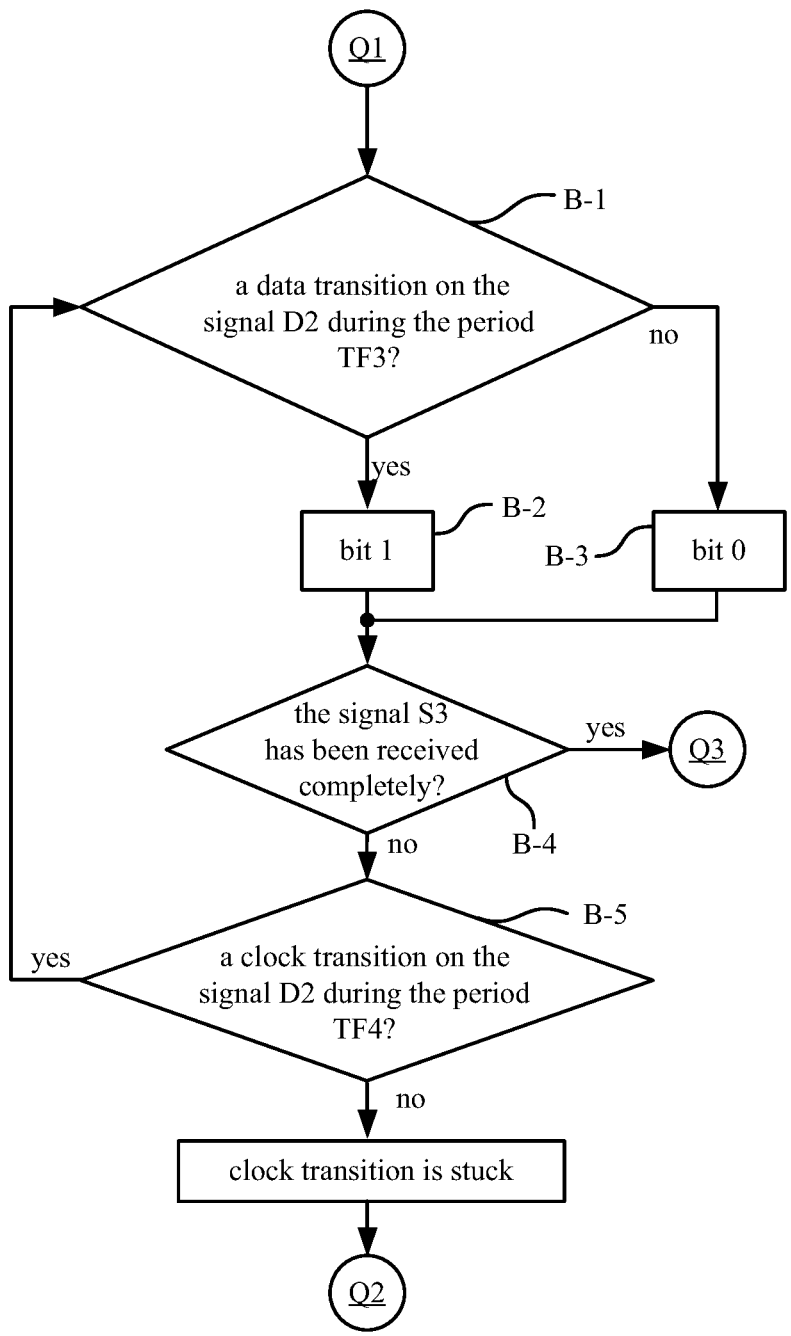
FIG. 4B is a flow diagram illustrating an operation in FIG. 4A according to some embodiments of the present disclosure.

FIG. 4A is a flow diagram illustrating the data processing method 400 according to some embodiments of the present disclosure, and FIG. 4B is a flow diagram illustrating an operation S440 in FIG. 4A according to some embodiments of the present disclosure. In some embodiments, the data processing method 400 may be implemented to Auto-negotiation of automotive electronics. In some embodiments, the data processing method 400 may be performed by the transceiver 100. For ease of understanding, the data processing method 400 is described with reference to aforementioned figures.

In an operation S410, in response to the predetermined pattern, the detector circuit 134A outputs the detection signal SD to the control circuit 134D, to start to perform the negotiation.

In an operation S420, the decoder 134B detects the first transition edge on the signal S3, to set the sampling points $SPX_0$-$SPX_3$ of the decoder circuit EA and the sampling points $SNX_0$-$SNX_3$ of the decoder circuit EB, in which the sampling point $SNX_0$ is earlier than the sampling point $SPX_0$ by the period T/2.

In an operation S430, the decoder circuit EA analyzes the signal S3 at the sampling points $SPX_0$-$SPX_3$, to generate the signal D1.

In specific, the operation S430 includes steps A-1 to A-5. In the step A-1, according to the signal D1, the decoder circuit EA can determine whether there is a data transition on the signal S3 during the period TF1 or not. If yes, to determine the data on the signal S3 is the bit 1 (that is, the step A-2). Alternately, to determine the data on the signal S3 is the bit 0 (that is, the step A-3). In the step A-4, it is to determine whether the signal S3 has been received completely or not. If yes, the decoder circuit EA outputs the signal D1 to the checker circuit 134C, and the operation S450 is performed. Alternatively, if not, the step A-5 is performed. In the step A-5, according to the signal D1, the decoder circuit EA continues to determine whether there is a clock transition on the signal S3 during the period TF2 or not. If yes, the operation S410 is performed repeatedly to continue to receive the signal S3. Alternatively, if no, it is that the clock transition of the signal S3 is stuck. Under this condition, the signal S1 transmitted from the transmitter TX may be not conformed to IEEE 802.3 bp, so the decoder circuit EA could not receive the signal S3.

In the operation S440, the decoder circuit EB analyzes the signal S3 at the sampling points $SPY_0$-$SPY_3$, to generate the signal D2. In detailed, as illustrated in FIG. 4B, the operation S440 includes steps B-1 to B-5. The steps B-1 to B-5 are similar to the steps A-1 to A-5, so they are not described herein again. Relationships between the steps B-1 to B-5 and the data processing method 400 can be understood from connection points Q1-Q3.

In the operation S450, the checker circuit 134C checks the signal D1 and the signal D2, to generate the check result SR. If the signal D1 passes the check, it is that the decoder circuit EA can receive the signal S3 successfully. Alternatively, if the signal D1 does not pass the check, it is that the decoder circuit EA could not receive the signal S3 successfully. Similarly, if the signal D2 passes the check, it is that the decoder circuit EB can receive the signal S3 successfully. Alternatively, if the signal D2 does not pass the check, it is that the decoder circuit EB could not receive the signal S3 successfully.

In the operation S460, the control circuit 134D selects at least one of the decoder circuit EA or the decoder circuit EB according to the check result SR for receiving subsequent data.

For example, the check result SR may be as:

| the decoder circuit EA | the decoder circuit EB | the check result SR |
|---|---|---|
| fail | fail | fail |
| fail | pass | pass |
| pass | fail | pass |
| pass | pass | pass |

According to the table above, when at least one of the decoder circuit EA or the decoder circuit EB receives the signal S3 successfully, the control circuit 134D can select the at least one for receiving subsequent data. When both of the decoder circuit EA and the decoder circuit EB could not receive the signal S3 successfully, it is that this negotiation fails, and the received signal S3 is erased.

The above operations of the data processing method 400 are only from illustration, and are not necessarily performed in the order described. The order of the operations of the filtering method 300 disclosed in the present disclosure are able to be changed, to be added, to be replaced, to be omitted, or the operations are able to be executed simultaneously or partially simultaneously as appropriate, in accordance with the spirit and scope of various embodiments of the present disclosure.

IEEE 802.3 bp and Manchester Coding are taken as examples in above embodiments, but the present disclosure is not limited thereto.

As described above, the data processing device and the data processing method in some embodiments of the present disclosure can utilize multiple decoder circuits to perform the parallel decoding on the received signal. Thus, accuracy of receiving the signal can be increased significantly under a condition that the sampling rate is maintained to be the same.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A data processing device comprising:
    a plurality of decoder circuits configured to set a plurality of groups of first sampling points and a plurality of groups of second sampling points according to an initial transition edge of a first signal, and perform a parallel decoding on the first signal according to the groups of first sampling points and the groups of second sampling points, in order to generate a second signal and a third signal;
    a checker circuit configured to check the second signal and the third signal, in order to generate a check result; and
    a control circuit configured to select at least one of the decoder circuits according to the check result for receiving subsequent data.

2. The data processing device of claim 1, wherein a first sampling point of the groups of second sampling points is earlier than a first sampling point of the groups of first sampling points by a predetermined period.

3. The data processing device of claim 2, wherein the first signal has a cycle, and the predetermined period is ¼ time the cycle.

4. The data processing device of claim 3, wherein a plurality of sampling points of the groups of first sampling points are spaced from each other by the predetermined period, and a plurality of sampling points of the groups of second sampling points are spaced from each other by the predetermined period.

5. The data processing device of claim 1, wherein the decoder circuits comprises a first decoder circuit and a second decoder circuit, the first decoder circuit is configured to sample the first signal according to the groups of first sampling points to generate the second signal, and the second decoder circuit is configured to sample the first signal according to the groups of second sampling points to generate the third signal.

6. The data processing device of claim 5, wherein the groups of first sampling points comprises a first group of sampling points and a second group of sampling points sequentially, wherein the first decoder circuit is configured to sample the first signal according to the first group of sampling points and the second group of sampling points to generate the second signal, and determine whether there is a data transition on the first signal or not according to signal values of the second signal during a first period, and determine whether there is a clock transition on the first signal or not according to signal values of the second signal during a second period,
    wherein the first period is a period from a second sampling point of the first group of sampling points to a last sampling point of the first group of sampling points, and the second period is a period from the last sampling point to a second sampling point of the second group of sampling points.

7. The data processing device of claim 6, wherein the groups of second sampling points comprises a third group of sampling points and a fourth group of sampling points sequentially, wherein the second decoder circuit is configured to sample the first signal according to the third group of sampling points and the fourth group of sampling points to generate the third signal, and determine whether there is a data transition on the first signal or not according to signal values of the third signal during a third period, and determine whether there is a clock transition on the first signal or not according to signal values of the third signal during a fourth period, wherein the third period is a period from a second sampling point of the third group of sampling points to a last sampling point of the third group of sampling points, and the fourth period is a period from the last sampling point to a second sampling point of the fourth group of sampling points.

8. The data processing device of claim 1, wherein the checker circuit is configured to perform a Cyclic Redundancy Check to check the second signal and the third signal, to generate the check result.

9. The data processing device of claim 1, wherein the first signal is encoded as a form of Manchester Coding.

10. The data processing device of claim 1, wherein the first signal is conformed to an IEEE 802.3 bp protocol.

11. A data processing method comprising:
    setting a plurality of groups of first sampling points and a plurality of groups of second sampling points according to an initial transition edge of a first signal;
    performing a parallel decoding on the first signal by a plurality of decoder circuits according to the groups of first sampling points and the groups of second sampling points, in order to generate a second signal and a third signal;
    checking the second signal and the third signal, in order to generate a check result; and
    selecting at least one of the decoder circuits according to the check result for receiving subsequent data.

12. The data processing method of claim 11, wherein the groups of first sampling points comprises a first group of sampling points and a second group of sampling points sequentially, wherein performing the parallel decoding on the first signal by the decoder circuits according to the groups of first sampling points and the groups of second sampling points comprises:
    sampling the first signal by a first decoder circuit of the decoder circuits according to the first group of sampling points and the second group of sampling points to generate the second signal; and
    determining whether there is a data transition on the first signal or not according to signal values of the second signal during a first period, and determining whether there is a clock transition on the first signal or not according to signal values of the second signal during a second period,
    wherein the first period is a period from a second sampling point of the first group of sampling points to a last sampling point of the first group of sampling points, and the second period is a period from the last sampling point to a second sampling point of the second group of sampling points.

13. The data processing method of claim 12, wherein the groups of second sampling points comprises a third group of sampling points and a fourth group of sampling points sequentially, wherein performing the parallel decoding on the first signal by the decoder circuits according to the groups of first sampling points and the groups of second sampling points further comprises:
    sampling the first signal by a second decoder circuit of the decoder circuits according to the third group of sampling points and the fourth group of sampling points to generate the third signal; and
    determining whether there is a data transition on the first signal or not according to signal values of the third signal during a third period, and determining whether there is a clock transition on the first signal or not according to signal values of the third signal during a fourth period,
    wherein the third period is a period from a second sampling point of the third group of sampling points to a last sampling point of the third group of sampling points, and the fourth period is a period from the last sampling point to a second sampling point of the fourth group of sampling points.

14. The data processing method of claim 11, wherein a first sampling point of the groups of second sampling points is earlier than a first sampling point of the groups of first sampling points by a predetermined period.

15. The data processing method of claim 14, wherein the first signal has a cycle, and the predetermined period is ¼ time the cycle.

16. The data processing method of claim 14, wherein a plurality of sampling points of the groups of first sampling points are spaced from each other by the predetermined period, and a plurality of sampling points of the groups of second sampling points are spaced from each other by the predetermined period.

17. The data processing method of claim 11, wherein the decoder circuits comprises a first decoder circuit and a second decoder circuit, wherein performing the parallel decoding on the first signal by the decoder circuits according to the groups of first sampling points and the groups of second sampling points comprises:
    sampling the first signal by the first decoder circuit according to the groups of first sampling points to generate the second signal; and
    sampling the first signal by the second decoder circuit according to the groups of second sampling points to generate the third signal.

18. The data processing method of claim 11, wherein checking the second signal and the third signal in order to generate the check result comprises:
    performing a Cyclic Redundancy Check to check the second signal and the third signal, to generate the check result.

19. The data processing method of claim 11, wherein the first signal is encoded as a form of Manchester Coding.

20. The data processing method of claim 11, wherein the first signal is conformed to an IEEE 802.3 bp protocol.

\* \* \* \* \*